(12) United States Patent
Cho

(10) Patent No.: US 11,391,367 B2
(45) Date of Patent: Jul. 19, 2022

(54) METHOD OF DETECTING GEAR SHIFT POSITION OF ELECTRIC SHIFT-BY-WIRE SYSTEM

(71) Applicant: Hyundai Kefico Corporation, Gunpo-si (KR)

(72) Inventor: Hyoung Sang Cho, Gunpo-si (KR)

(73) Assignee: Hyundai Kefico Corporation, Gunpo-si (KR)

(*) Notice: Subject to any disclaimer, the term of this patent is extended or adjusted under 35 U.S.C. 154(b) by 71 days.

(21) Appl. No.: 17/113,641

(22) Filed: Dec. 7, 2020

(65) Prior Publication Data

US 2021/0180685 A1 Jun. 17, 2021

(30) Foreign Application Priority Data

Dec. 13, 2019 (KR) .................. 10-2019-0167297

(51) Int. Cl.
| | | |
|---|---|---|
| F16H 61/32 | (2006.01) | |
| F16H 61/00 | (2006.01) | |
| G01D 5/14 | (2006.01) | |
| G01B 7/30 | (2006.01) | |
| B60Q 9/00 | (2006.01) | |
| G01R 19/00 | (2006.01) | |
| F16H 61/12 | (2010.01) | |
| F16H 61/02 | (2006.01) | |

(52) U.S. Cl.
CPC ............... *F16H 61/00* (2013.01); *B60Q 9/00* (2013.01); *G01B 7/30* (2013.01); *G01D 5/145* (2013.01); *G01R 19/0092* (2013.01); *F16H 61/0204* (2013.01); *F16H 2061/1216* (2013.01)

(58) Field of Classification Search
CPC ...... G01R 19/0092; G01D 5/145; G01B 7/30; B60Q 9/00; F16H 61/00; F16H 2061/1216; F16H 61/0204
See application file for complete search history.

(56) References Cited

FOREIGN PATENT DOCUMENTS

| | | |
|---|---|---|
| JP | 2009112151 A | 5/2009 |
| JP | 2013-167310 A | 8/2013 |
| JP | 2015-096005 A | 5/2015 |
| KR | 2010-0050710 A | 5/2010 |
| KR | 10-1957513 B1 | 3/2019 |
| KR | 101957508 B1 | 3/2019 |
| KR | 10-1987561 B1 | 6/2019 |
| WO | WO 2013-179997 A1 | 5/2013 |

*Primary Examiner* — Alesa Allgood
(74) *Attorney, Agent, or Firm* — Morgan, Lewis & Bockius LLP

(57) ABSTRACT

A method of detecting a gear shift position of an electric shift-by-wire system is proposed. The method includes setting, as a reference position, a motor position at a time point when shift is completed to a target shift stage; rotating the motor until the motor no longer rotates in a P stage-engaging direction from the reference position; measuring a rotation amount of the motor with respect to the reference position; and determining the gear shift position by determining that the reference position is a P stage when the measured rotation amount of the motor is less than or equal to a predetermined first reference value, and the reference position is not the P stage when the measured rotation amount of the motor is greater than the first reference value.

11 Claims, 5 Drawing Sheets

METHOD OF DETECTING GEAR SHIFT POSITION OF ELECTRIC SHIFT-BY-WIRE SYSTEM

CROSS REFERENCE TO RELATED APPLICATIONS

The present application claims priority to Korean Patent Application No. 10-2019-0167297 filed on Dec. 13, 2019, the entire contents of which is incorporated herein for all purposes by this reference.

BACKGROUND OF THE INVENTION

Field of the Invention

The present disclosure relates to a method of detecting a gear shift position of an electric shift-by-wire system and, more specifically, to a method of detecting a gear shift position of an electric shift-by-wire system, the method being configured to be capable of detecting the gear shift position using only an inexpensive Hall sensor.

Description of the Related Art

Unlike a mechanical shift lever system that uses a mechanical link structure such as a wire, an electric shift-by-wire system performs shifting using an electric signal. Specifically, since the electric shift-by-wire system is configured to transmit shift lever operation information as an electric signal to rotate the motor, thereby switching a shift stage, and has a small shift shock and vibration, vehicles adopting the electric shift-by-wire system are gradually increasing.

The electric shift-by-wire system performs shifting using a detent spring and a detent plate connected to a motor. Specifically, when the motor is rotated, the detent plate connected to the motor also rotates along with the motor, and the detent spring moves from one root fillet to another formed in the detent plate, whereby the shift is performed.

However, when a structural or electrical defect occurs according to vehicle operation, a shift stage different from a driver's intention may be engaged. Particularly, when the target shift stage is the parking stage (P stage), a safety accident may occur due to vehicle rolling, so it is necessary to periodically check whether the correct shift is being performed.

Meanwhile, a method of checking the absolute position of the motor using a position sensor in the related art has been used. However, since a high-precision position sensor is expensive, there is a problem that the price competitiveness of the product is lowered.

SUMMARY OF THE INVENTION

The present disclosure has been made to solve the above problems, and it is an objective of the present disclosure to provide a method of detecting a gear shift position of an electric shift-by-wire system, the method being configured to be capable of rapidly and correctly detecting the gear shift position using an inexpensive Hall sensor, instead of an expensive absolute position sensor.

However, the objective of the present disclosures is not limited thereto, and may be variously expanded within a range not departing from the spirit and scope of the present invention.

In order to achieve the above objective, a method of detecting a gear shift position of an electric shift-by-wire system according to an exemplary embodiment includes setting, as a reference position, a motor position at a time point when shift is completed to a target shift stage; rotating the motor until the motor no longer rotates in a P stage-engaging direction from the reference position; measuring a rotation amount of the motor with respect to the reference position; and determining the gear shift position by determining that the reference position is a P stage when the measured rotation amount of the motor is less than or equal to a predetermined first reference value, and the reference position is not the P stage when the measured rotation amount of the motor is greater than the first reference value.

In the exemplary embodiment, the first reference value may be smaller than a rotation amount by which the motor rotates to shift from the Not P stage to the P stage.

In the exemplary embodiments, the first reference value may be smaller than a rotation amount by which the motor rotates to shift from any one of an R stage, an N stage, and a D stage to the P stage.

In the exemplary embodiments, the method may further include measuring a driving current of the motor. The rotating of the motor may include rotating the motor in the P stage-engaging direction until the driving current of the motor increases rapidly.

In the exemplary embodiments, the measuring of the rotation amount may include measuring a relative rotation amount of the motor with respect to the reference position.

In the exemplary embodiments, the method may further include restoring the motor to the reference position after the determining of the gear shift position.

In the exemplary embodiments, the method may further include receiving information on a shift stage lever operation of a driver; and outputting a warning signal when the received shift stage lever operation information and the gear shift position determined in the determining of the gear shift position are different from each other.

In the exemplary embodiments, the method may further include determining whether or not to detect the gear shift position. The determining whether or not to detect the gear shift position may be performed by detecting the gear shift position when the target gear stage is the P stage.

In order to achieve the above objective, a method of detecting a gear shift position of an electric shift-by-wire system according to another embodiment includes setting, as a reference position, a motor position at a time point when shift is completed; rotating the motor by a predetermined second reference value in a P stage-engaging direction from the reference position; measuring a rotation amount of the motor with respect to the reference position; and determining the gear shift position by determining that the reference position is a P stage when the measured rotation amount of the motor is smaller than a predetermined second reference value, and the reference position is not the P stage when the rotation amount of the motor is equal to or greater than the second reference value.

In the exemplary embodiments, the second reference value may be greater than a maximum rotation amount by which the motor is capable of rotating in the P stage-engaging direction from the P stage.

In the exemplary embodiments, the method may further include restoring the motor to the reference position after the determining of the gear shift position; receiving information on the shift stage lever operation of a driver; and outputting a warning signal when the received shift stage lever operation information and the gear shift position determined in the determining of the gear shift position are different from each other.

The method of detecting the gear shift position for an electric shift-by-wire system according to embodiments of the present disclosure has an advantage that it is possible to quickly determine the current gear shift position through a simple motor driving. In addition, since the gear shift position can be accurately detected using only relatively inexpensive sensors, the price competitiveness of the product can be improved and the reliability of shift control can be secured.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
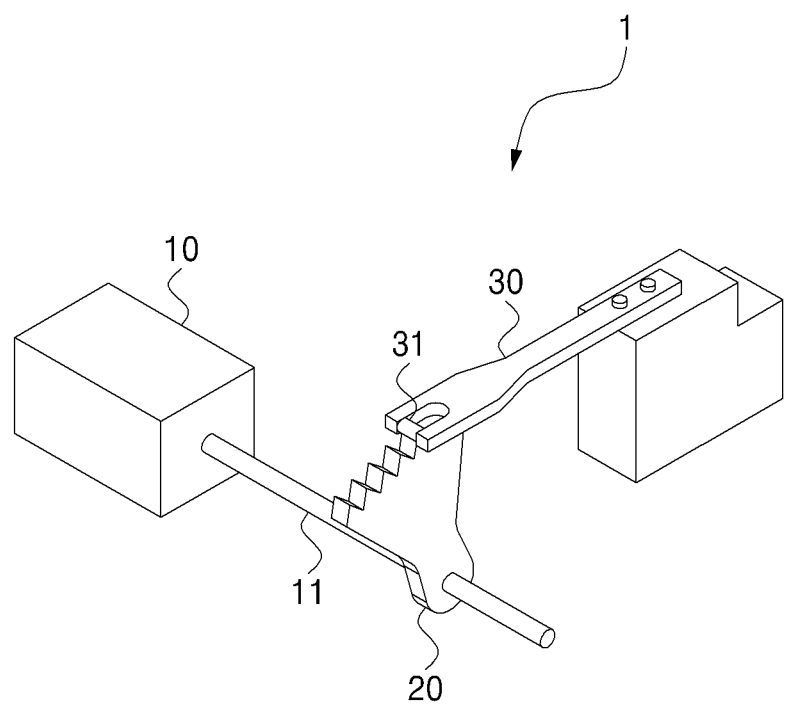
FIG. 1 is a perspective view showing an electric shift-by-wire system.

Specific structural or functional descriptions in embodiments of the present disclosure disclosed herein are exemplified only for the purpose of describing the embodiments of the present disclosure, and the embodiments of the present disclosure can be implemented in various forms and should not be construed as being limited to the embodiments described in the specification.

Since the present disclosure can apply various changes and have various forms, specific embodiments will be illustrated in the drawings and described in detail in the description. However, it is to be understood that the description is not intended to limit the present disclosure to a specific form of disclosure, but includes all changes, equivalents, and substitutes included in the spirit and scope of the present disclosure.

Although terms such as first and second may be used to describe various elements, the components should not be limited by the terms. The terms may be used for the purpose of distinguishing one component from another component. For example, without departing from the scope of the present disclosure, a first component may be referred to as a second component, and similarly, the second component may also be referred to as the first component.

It should be understood that, when a constituent element is referred to as being "coupled to" or "connected to" a different constituent element, this means that the constituent element may be coupled to or connected to the different constituent element or means that an intervening constituent element may be present therebetween. In contrast, it should be understood that, when a constituent element is referred to as being "directly coupled to" or "directly connected to" a different constituent element, this means that no intervening constituent element is present therebetween. Expressions describing a relationship between constituent elements, such as "between" and "directly between", and "adjacent to" and "directly adjacent to", should be construed in the same manner.

The terms used in the present specification are only used to describe specific embodiments, and are not intended to limit the present disclosure. Singular expressions include plural expressions unless the context clearly indicates otherwise. In the present specification, it is to be understood that terms such as "comprise" or "have" are intended to designate the existence of the specified features, numbers, steps, actions, components, parts, or combinations thereof, and the possibility of the presence or addition of one or more other features or numbers, steps, actions, elements, parts, or combinations thereof is not preliminarily excluded.

Unless otherwise defined, all terms used herein, including technical or scientific terms, have the same meaning as commonly understood by one of ordinary skill in the art to which the present disclosure belongs. Terms such as those defined in commonly used dictionaries should be interpreted as having a meaning consistent with the meaning in the context of the related art, and unless explicitly defined in the present specification, the terms should not be interpreted in an ideal or excessively formal meaning.

Hereinafter, preferred embodiments of the present disclosure will be described in more detail with reference to the accompanying drawings. The same reference numerals are used for the same elements in the drawings, and duplicate descriptions for the same elements are omitted.

First, an electric shift-by-wire system will be described with reference to FIGS. 1 and 2.

Figure 2A:
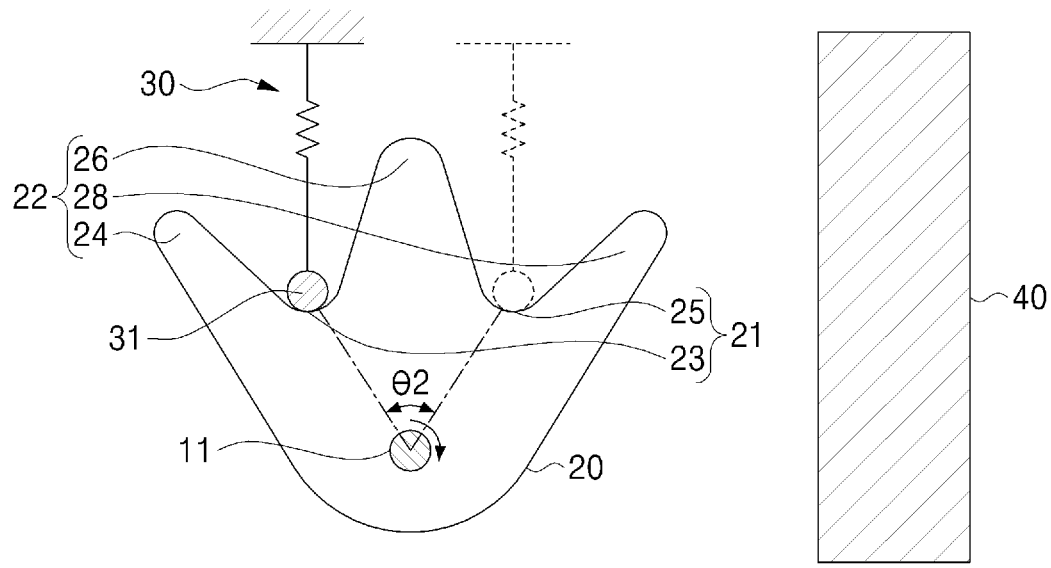
FIG. 2A and FIG. 2B are views showing operations of a detent spring according to rotation of a detent plate.
Figure 2B:
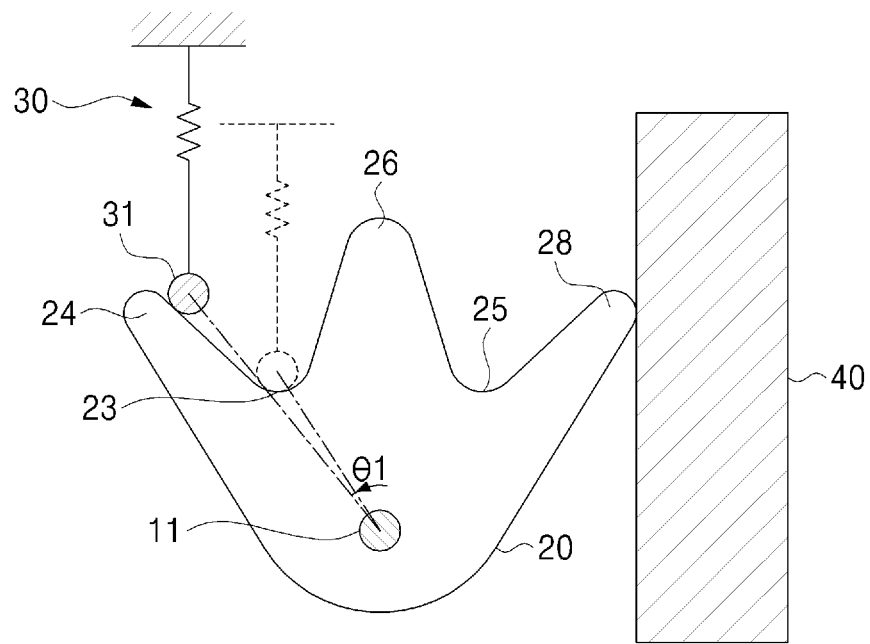

FIG. 1 is a perspective view showing an electric shift-by-wire system; and FIGS. 2A and 2B are views showing operations of a detent spring according to rotation of a detent plate.

Referring to FIGS. 1, 2A, and 2B, the electric shift-by-wire system 1 includes a motor 10 that controls a shift stage, and a detent plate 20 and a detent spring 30 provided to change the shift stage according to driving of the motor 10.

When a driver operates a shift lever (not shown) to a specific position, an electric signal corresponding to the position may be transmitted to the motor 10. The motor 10 may rotate in a forward direction or in a reverse direction according to the received electric signal.

The detent plate 20 may be connected to the motor 10 through a rotation shaft 11. Therefore, the rotation of the motor 10 may be transmitted to the detent plate 20 through the rotation shaft 11. The detent plate 20 may also rotate in the same direction as the motor 10 rotates.

As shown in FIGS. 2A and 2B, the detent plate 20 may have a plurality of root fillets 21 and a plurality of top lands 22. The root fillet 21 is a position at which a roller 31 of the detent spring 30 is seated, and a specific shift stage may correspond to each root fillet 21. Therefore, as the roller 31 moves from one root fillet to another, the shift stage may be changed.

For example, the detent plate 20 may have two root fillets 21 and three top lands 22 as shown in FIGS. 2A and 2B. Specifically, the detent plate 20 may have a first root fillet 23 and a second root fillet 25, and first to third top lands 24, 26, and 28. Herein, the first root fillet 23 may correspond to a P stage, and the second root fillet 25 may correspond to a Not P stage. Herein, the P stage means a parking stage, and the Not P stage means a stage other than the parking stage. When the driver operates to switch the shift lever from the P stage to the Not P stage, the motor 10 and the detent plate 20 rotate, so that the roller 31 may move from the first root fillet 23 to the second root fillet 25.

Meanwhile, although the detent plate 20 having two root fillets 21 is shown in FIGS. 2A and 2B, the present disclosure is not limited only to a two-stage detent plate. For example, even when the detent plate 20 has a total of four root fillets including a P stage, an R stage, an N stage, and a D stage, the present disclosure may be applied equally. For convenience of explanation, only the case where the detent plate 20 has two root fillets 21 will be described hereinafter.

The detent spring 30 is a plate-shaped elastic member having elastic force, and is provided to have a roller 31 provided at one end and to be fixed at the other end. When the motor 10 and the detent plate 20 rotate, the roller 31 may move along the root fillet 21 and the top land 22 of the detent plate 20. For example, when switching the shift lever from the Not P stage to the P stage, as the motor 10 and the detent plate 20 rotates by a second angle θ2 in one direction, the roller 31 may move from the second root fillet 25 through the second top land 26 to the first roof fillet 23, as shown in FIG. 2A. Accordingly, the shift stage may be changed from the Not P stage to the P stage.

Meanwhile, when the motor 10 and the detent plate 20 are continuously rotated in the same direction after switching the shift lever from the Not P stage to the P stage, the roller 31 may move from the first roof fillet 23 to the first top land 24. However, the electric shift-by-wire system 1 has a mechanical wall that restrict the detent plate 20 so that the detent plate 20 no longer rotates, and for convenience of explanation, such a wall will be referred to as a P-direction wall 40. That is, even when the motor 10 and the detent plate 20 are continuously rotated in the same direction after shifting from the not P stage to the P stage, the roller 31 may no longer move after moving a certain distance from the first roof fillet 23 to the first top land 24. This is because the rotation of the detent plate 20 is limited by the P-direction wall 40. Herein, the motor 10 and the detent plate 20 may rotate at most by a first angle θ1 in a P stage-engaging state, as shown in FIG. 2B.

Meanwhile, the first angle θ1 and the second angle θ2 are predetermined in designing and manufacturing stages of the vehicle, and in some cases, may be corrected through learning while driving the vehicle. In addition, the second angle θ2 may typically have a larger value than the first angle θ1.

According to the present invention, the current gear shift position may be detected by using a characteristic that, when the motor 10 is rotated in a P stage-direction at a Not P stage-engaging state, the motor 10 may be further rotated than when the motor 10 is rotated in the same direction at the P stage-engaging state. Hereinafter, an apparatus for detecting a gear shift position according to the present invention will be described first.

Figure 3:
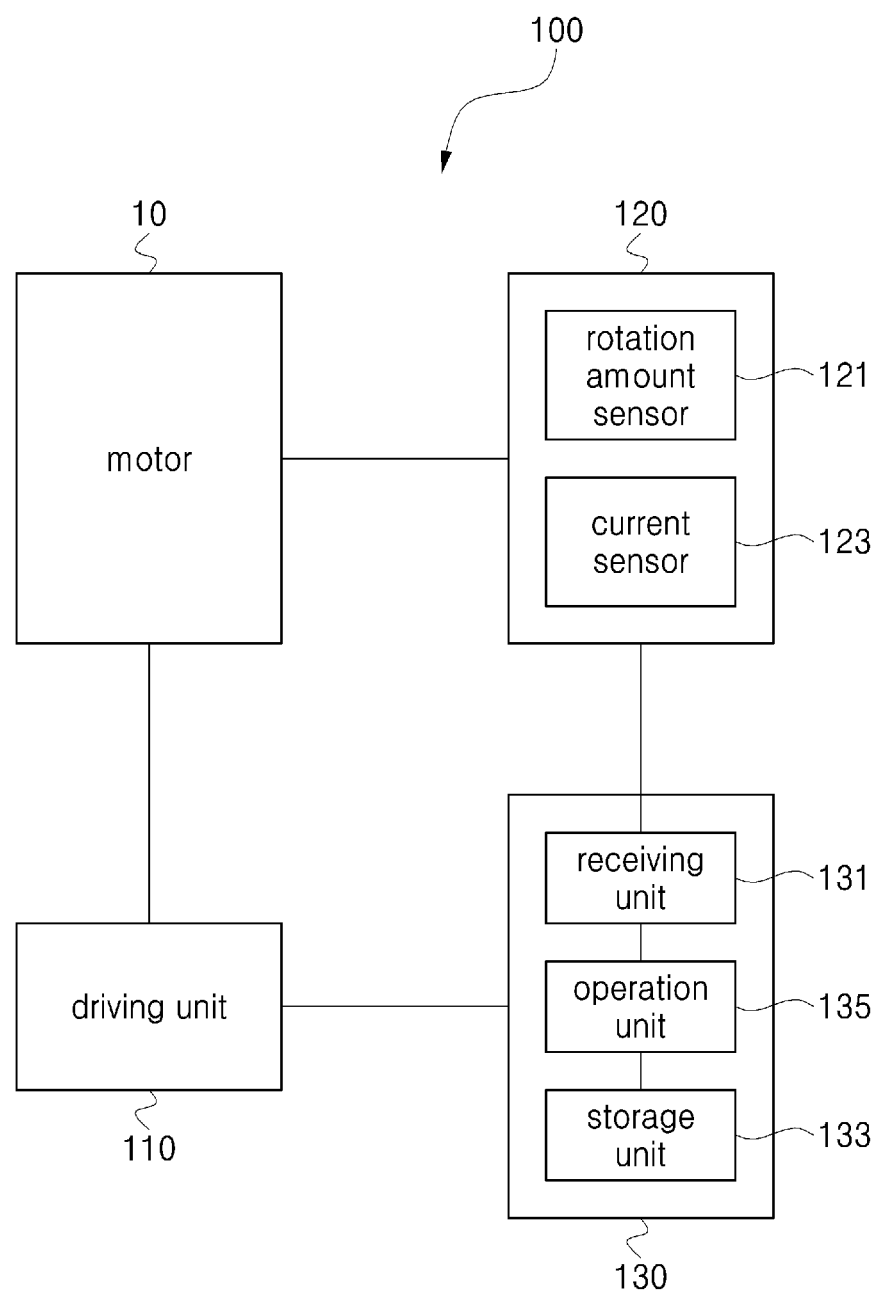
FIG. 3 is a block diagram showing an apparatus for detecting a gear shift position of an electric shift-by-wire system according to the present disclosure.

FIG. 3 is a block diagram showing an apparatus for detecting a gear shift position of an electric shift-by-wire system according to the present disclosure.

Referring to FIG. 3, the apparatus 100 for detecting the gear shift position of the electric shift-by-wire system includes a driving unit 110 that outputs a driving signal to the motor 10, a measurement unit 120 that measures a rotation amount and a driving current of the motor 10, and a control unit 130 that determines the gear shift position corresponding to a specific shift stage using the measured information.

The driving unit 110 outputs a driving signal to the motor 10, and may rotate the motor 10 in a P stage-engaging direction from a Not P stage or the motor 10 in a Not P stage-engaging direction form a P stage. For convenience of explanation, rotating the motor 10 so that the shift stage is changed from the Not P stage to the P stage is referred to as rotating the motor 10 in a forward direction, and rotating from the P stage to the Not P stage is referred to as rotating the motor 10 in a reverse direction.

The measurement unit 120 may include a rotation amount sensor 121 and a current sensor 123.

The rotation amount sensor 121 may measure the rotation amount of the motor 10 and transmit the same to the control unit 130. For example, the rotation amount sensor 121 may be a Hall sensor. The Hall sensor may count the moments when the rotation shaft 11 of the motor 10 passes through the Hall element to measure a relative rotation amount of the motor 10. Information on the measured rotation amount of the motor 10 may be provided to the control unit 130.

The current sensor 123 may measure the driving current applied to the motor 10 and transmit the same to the controller 130. Herein, the driving current is required to rotate the motor 10, and the higher external force acting on the motor 10, such as the elastic restoring force of the detent spring 30, the larger current required to drive the motor 10. For example, when the detent plate 20 contacts the P-direction wall 40 so that the motor 10 may no longer rotate, a larger driving current may be applied to the motor 10 than when the motor 10 rotates. The current sensor 123 may measure the magnitude of the driving current applied to the motor 10 when the motor 10 rotates and provide the same to the control unit 130.

The control unit 130 may include a receiving unit 131, a storage unit 133, and an operation unit 135.

The receiving unit 131 may receive information measured from the measurement unit 120. Specifically, the receiving unit 131 may receive information about the rotation amount of the motor 10 from the rotation amount sensor 121, and receive information about the magnitude of the driving current applied to the motor 10 from the current sensor 123. The receiving unit 131 may transfer the information to the calculating unit 135.

The storage unit 133 may store reference value information for determining the gear shift position. The operation unit 135 may detect the gear shift position of the motor 10 by using the rotation amount information of the motor 10 and the driving current information of the motor 10.

For example, as shown in FIG. 2B, when the rotation amount of the motor 10 capable of rotating from the P stage to the P-direction wall is a first angle θ1, a first reference value corresponding thereto may be stored in the storage unit 133. The first reference value may be equal to the first angle θ1, or may be a value larger than the first angle θ1 and smaller than the second angle θ2. That is, in the case that the motor 10 is rotated as far as possible in the forward direction after the shift is completed, it may be determined that the gear shift position is the P stage when the rotation amount is less than or equal to the first reference value.

In contrast, as shown in FIG. 2A, when the rotation amount of the motor 10 is the second angle θ2 when shifting from the Not P stage to the P stage, the second reference value corresponding thereto may be stored in the storage unit 133. The second reference value may be equal to the second angle θ2, or may be smaller than the second angle θ2 and greater than the first reference value. That is, in the case that the motor 10 is rotated in the forward direction after the shift is completed, it may be determined that the gear shift position at the time of completion of the shift is the Not P stage when the motor 10 is capable of rotating by more than the second reference value.

Meanwhile, whether the motor 10 reaches a position that is no longer capable of rotating may be determined using driving current information obtained through the current sensor 123. Specifically, when the driving current of the motor 10 measured by the current sensor 123 increases rapidly, the calculation unit 135 may determine that the motor reaches a position that no longer capable of rotating. This is because when the detent plate 20 reaches the P-direction wall 40, the driving current of the motor 10 rapidly increases.

In addition, although not shown, the apparatus 100 for detecting the gear shift position of the electric shift-by-wire system according to the present invention may further include a warning unit. The warning unit may output a warning signal when the shift stage selection information of the shift lever and the gear shift position determined by the controller 130 are different from each other. Herein, it is possible to enable the driver to take appropriate measures, thereby preventing accidents.

As described above, the apparatus 100 for detecting the gear shift position of the electric shift-by-wire system according to the present invention can accurately determine the current gear shift position using only a relatively inexpensive sensor. Accordingly, the reliability of the shift control can be secured, and the price competitiveness of the product can be improved.

Hereinafter, a method of detecting the gear shift position using the apparatus 100 for detecting the gear shift position of the electric shift-by-wire system will be described in detail. The same reference numerals are used for the same components, and redundant descriptions are omitted.

Figure 4:
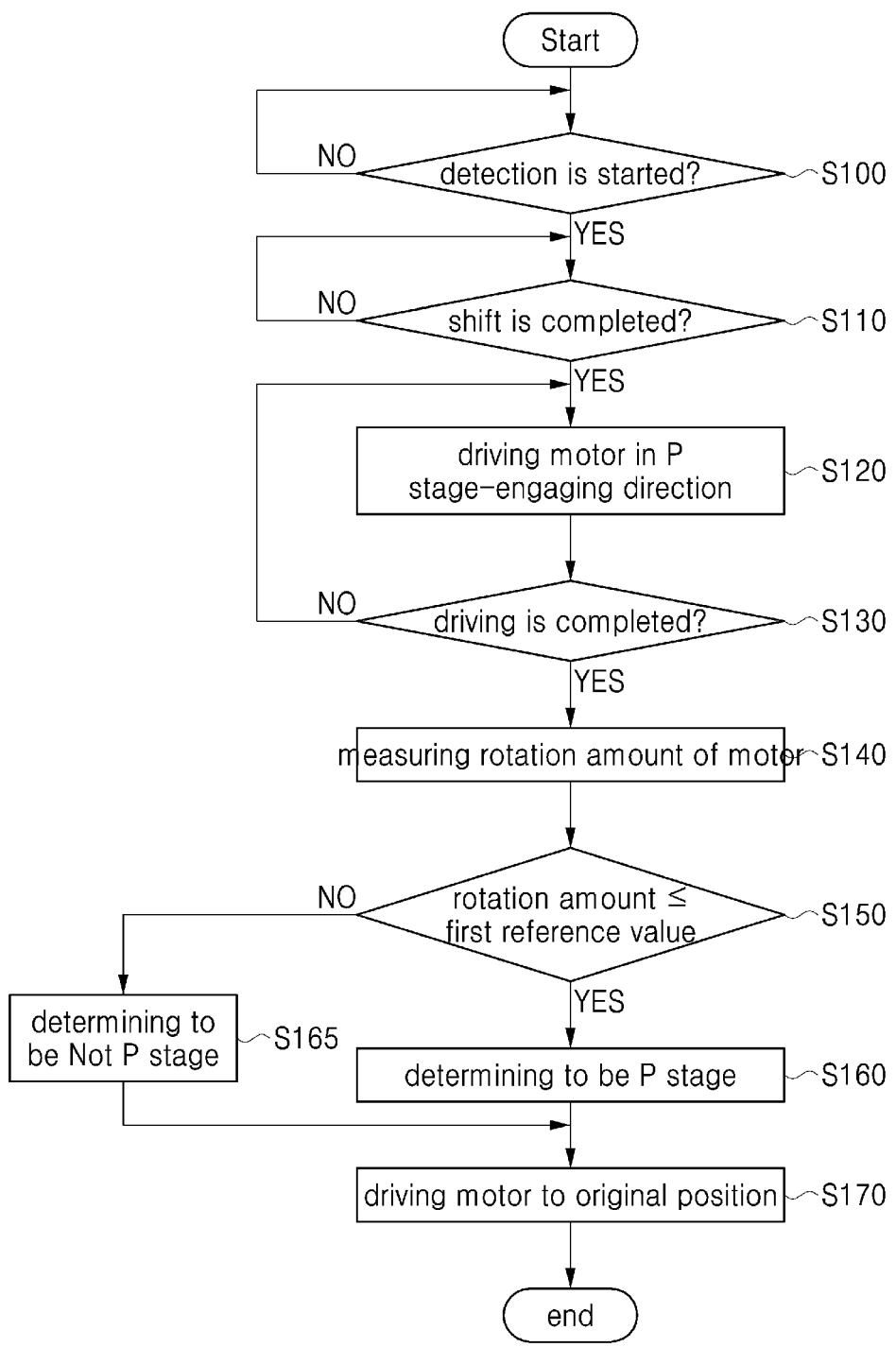
FIG. 4 and FIG. 5 are flowcharts illustrating a method of detecting the gear shift position using the apparatus for detecting the gear shift position shown in FIG. 3.

FIG. 4 is a flow chart illustrating a method of detecting a gear shift position of an electric shift-by-wire system according to an embodiment of the present invention.

Referring to FIG. 4, it is determined first whether or not to detect the gear shift position (S100).

The method according to the present disclosure includes a step of detecting the gear shift position while rotating the motor 10 in the P stage-engaging direction on the basis of a point in which the shift is completed to the target shift stage. When the target shift position is a P stage, it is not a problem since the gear stage is not changed during the process of detecting the gear shift position according to the present invention. However, when the vehicle is in driving operation, that is, when the target gear stage is not the P stage, the gear stage is changed to the P stage while detecting the gear shift position, which may lead to a safety accident. Therefore, it is determined first whether it is possible to detect the gear shift position.

For example, when the driver switches the shift lever to the P gear, it is possible to detect the gear shift position. This is because when the target shift position is the P stage, there is no fear that the gear stage is changed while detecting the gear shift position. In this case, the process of detecting the gear shift position may be performed whenever the target shift stage is changed to the P gear. Alternatively, the process of detecting the gear shift position is performed at a predetermined period of time, for example, once a month. Such a period at which the process of detecting the gear shift position is performed may be appropriately selected as needed.

However, unless the vehicle is in driving operation, it should be noted that there is no risk of a safety accident even when the gear stage is changed. Therefore, the method of detecting the gear shift position according to the present invention may be performed in a limited manner even when the target gear stage is not the P stage, in the case that the vehicle is not in driving operation.

Alternatively, the process of detecting the gear shift position may be performed only when a separate user input is applied. For example, a performance button for gear shift position detection is provided on a user interface connected to an electronic control unit (ECU), so that the process of detecting the gear shift position is performed only when the vehicle is not in driving operation and a user presses the button.

When it is determined that the process of detecting the gear shift position is performed, after the shift is completed (S110), the position of the motor 10 at a time point when the shift is completed is set as a reference position, and the motor 10 is driven as far as possible as in the forward direction from the reference position (S120). Herein, the forward direction refers to a direction in which the motor 10 is rotated when shifting from the not P stage to the P stage.

When the driving of the motor 10 is completed (S130), the rotation amount of the motor 10 with respect to the reference position is measured (S140).

In this case, when the motor 10 reaches a position that is no longer capable of rotating, it may be determined that the driving of the motor 10 is completed. Whether the motor 10 reaches a position that is no longer capable of rotating may be determined by whether the driving current measured through the current sensor 123 rises, as has been described above.

The measured rotation amount (S140) of the motor 10 is compared with the first reference value (S150).

The first reference value is a value stored in the storage unit 133. Specifically, when the rotation amount of the motor 10 capable of rotating from the P stage to the P-direction wall 40 is the first angle $\theta 1$, and the rotation amount of the motor 10 capable of rotating from the Not P stage to the P stage is the second angle ($\theta 2$), the first reference value may be equal to the first angle $\theta 1$ or may be larger than the first angle $\theta 1$ and smaller than the second angle $\theta 2$. In addition, in the case of a 4-position detent plate 20 having four roof fillets, the first reference value may be a value smaller than the rotation amount of the motor 10 capable of rotating from any one of an R stage, an N stage, and a D stage to the P stage.

When the rotation amount of the motor 10 is less than the first reference value, the gear shift position at a time point when the shift is completed is determined to be the P stage (S160), and when the rotation amount of the motor 10 is greater than the first reference value, the gear shift position is determined not to the P stage (S165).

For example, in the case of a vehicle equipped with a 2-position detent plate 20 having two roof fillets 21, the gear shift position at the time point when the shift is completed is determined to the P stage when the rotation amount of the motor 10 is less than the first reference value, and the gear shift position may be determined to be the Not P stage when the rotation amount of the motor 10 is greater than the first reference value.

Alternatively, in the case of a vehicle equipped with a 4-position detent plate 20 having four roof fillets, the gear shift position at a time point when the shift is completed is determined to be the P stage when the rotation amount of the motor 10 is less than the first reference value, and the gear shift position may be determined not to be the P stage when the rotation amount of the motor 10 is greater than the first reference value. In this case, it is possible to determine whether the shift stage at the time of completion of shifting is an R stage, an N stage, or a D stage by comparing the rotation amount of the motor 10 with the rotation amount for each gear stage pre-stored in the storage unit 133.

Thereafter, the motor 10 is driven in the reverse direction by the rotation amount measured in step S140 and then restored to the reference position (S170). Herein, the reverse direction refers to a direction in which the motor 10 is rotated when shifting from the P stage to the Not P stage.

Meanwhile, although not shown, when the shift stage selection information selected by the driver through the shift lever and the detected gear shift position information (S160, S165) are different from each other, the method according to the present disclosure may further include outputting a warning signal to the driver. Herein, it is possible to enable the driver to take appropriate measures, thereby preventing safety accidents in advance.

As described above, the method of detecting the gear shift position of the electric shift-by-wire system according to the present invention can quickly determine the current gear shift position through simple driving of the motor 10. In addition, since it is possible to accurately detect the gear shift position using only relatively inexpensive sensors, the price competitiveness of the product can be improved and the reliability of shift control can be secured.

Figure 5:
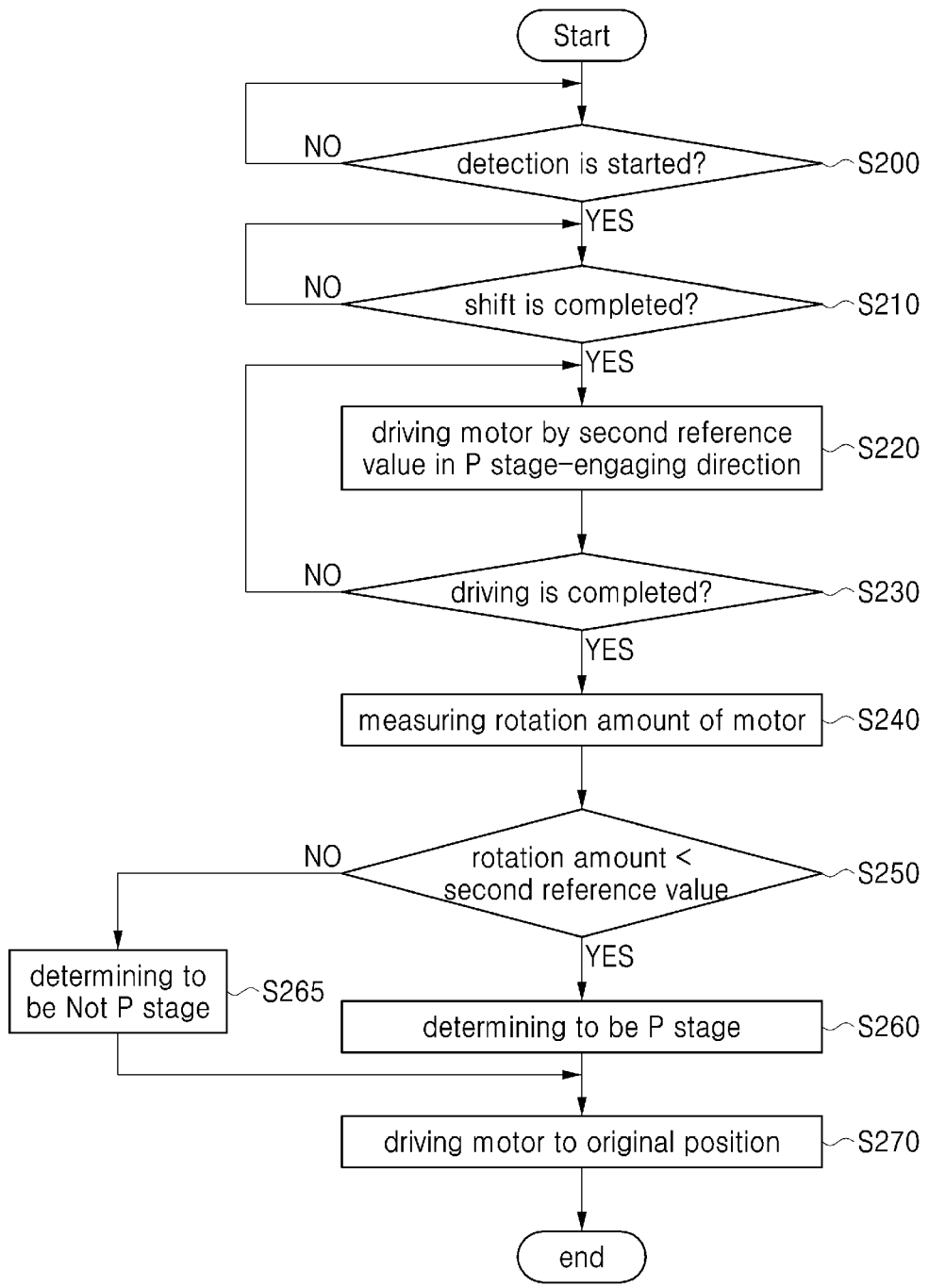

FIG. 5 is a flow chart showing a method of detecting a gear shift position of an electric shift-by-wire system according to another embodiment of the present invention.

The method of detecting the gear shift position of FIG. 4 is such that the motor 10 is driven to rotate as far as possible from the Not P stage to the P stage and then the rotation amount thereof is compared with the first reference value, while the method of detecting the gear shift position of FIG. 5 is such that the motor 10 is driven to rotate only by a predetermined second reference value and then the rotation amount thereof is compared with the second reference value. Hereinafter, a difference of the method of FIG. 4 and the method of FIG. 5 will be mainly described.

First, it is determined whether or not to detect the gear shift position (S200). For example, when the driver changes the shift lever to the P stage, or when the vehicle is stopped and the user presses a gear shift position detection button separately provided, it is possible to detect the gear shift position.

After the shift is completed (S210), the position of the motor 10 at the time point when the shift is completed is set as a reference position, and the motor 10 is driven in the forward direction from the reference position (S220). Herein, the motor 10 is driven to rotate only by a predetermined second reference value.

The second reference value is a value stored in the storage unit 133. Specifically, when the rotation amount of the motor 10 capable of rotating from the P stage to the P-direction wall 40 is the first angle θ1, and the rotation amount of the motor 10 capable of rotating from the Not P stage to the P stage is the second angle θ2, the second reference value may be equal to the second angle θ2 or may be smaller than the second angle θ2 and greater than the first angle θ1. That is, the motor 10 is rotated by an angle greater than the rotation amount (first angle) of the motor 10 capable of rotating from the P stage to the P-direction wall 40.

When the driving of the motor 10 is completed (S230), the rotation amount of the motor 10 with respect to the reference position is measured (S240). The measured rotation amount of the motor 10 (S240) is compared with the second reference value (S250).

When the measured rotation amount of the motor 10 is smaller than the second reference value, the gear shift position (the reference position) before the driving of the motor 10 (S220) is determined to be the P stage (S260), and when the measured rotation amount of the motor 10 is equal to or more than the second reference value, the gear shift position is determined not to be the P stage (S265). Herein, what the rotation amount of the motor 10 is equal to the second reference value means not only a case that they are completely equal to each other, but also a case that they are be substantially equal to each other within an allowable error range.

Meanwhile, in the case that the detent plate 20 has two roof fillets 21, when the rotation amount of the motor 10 is more than the second reference value, the reference position is the Not P stage, and in the case that the detent plate 20 has four roof fillets 21, the reference position may be one of an N stage, an R stage, and a D stage, as has been described above.

Thereafter, the motor 10 is driven in the reverse direction by the rotation amount measured in step S240 and then restored to the reference position (S270).

Meanwhile, although not shown, when the shift stage selection information selected by the driver through the shift lever and the detected gear shift position information (S260, S265) are different from each other, the method may further include outputting a warning signal to the driver. Herein, it is possible to enable the driver to take appropriate measures, thereby preventing safety accidents in advance.

As described above, the method of detecting the gear shift position of the electric shift-by-wire system according to the present invention can quickly determine the current gear shift position through simple driving of the motor 10. In addition, since it is possible to accurately detect the gear shift position using only relatively inexpensive sensors, the price competitiveness of the product can be improved and the reliability of shift control can be secured.

Although the above has been described with reference to embodiments of the present disclosure, it will be appreciated that those skilled in the art will be able to variously modify and change the present disclosure without departing from the spirit and scope of the present disclosure described in the following claims.

The invention claimed is:

1. A method of detecting a gear shift position of an electric shift-by-wire system that rotates a motor to change a shift stage, the method comprising:
    setting, as a reference position, a motor position at a time point when shift is completed to a target shift stage;
    rotating the motor until the motor no longer rotates in a P stage-engaging direction from the reference position;
    measuring a rotation amount of the motor with respect to the reference position; and
    determining the gear shift position by determining that the reference position is a P stage when the measured rotation amount of the motor is less than or equal to a predetermined first reference value, and the reference position is not the P stage when the measured rotation amount of the motor is greater than the first reference value.

2. The method of claim 1, wherein the first reference value is smaller than a rotation amount by which the motor rotates to shift from the Not P stage to the P stage.

3. The method of claim 1, wherein the first reference value is smaller than a rotation amount by which the motor rotates to shift from any one of an R stage, an N stage, and a D stage to the P stage.

4. The method of claim 1, further comprising:
    measuring a driving current of the motor,
    wherein the rotating of the motor comprises rotating the motor in the P stage-engaging direction until the driving current of the motor increases rapidly.

5. The method of claim 1, wherein the measuring of the rotation amount comprises measuring a relative rotation amount of the motor with respect to the reference position.

6. The method of claim 1, further comprising:
after the determining of the gear shift position, restoring the motor to the reference position.

7. The method of claim 1, further comprising:
receiving information on a shift stage lever operation of a driver; and
outputting a warning signal when the received shift stage lever operation information and the gear shift position determined in the determining of the gear shift position are different from each other.

8. The method of claim 1, further comprising:
determining whether or not to detect the gear shift position,
wherein the determining whether or not to detect the gear shift position is performed by detecting the gear shift position when the target gear stage is the P stage.

9. A method of detecting a gear shift position of an electric shift-by-wire system that rotates a motor to change a shift stage, the method comprising:
setting, as a reference position, a motor position at a time point when shift is completed;
rotating the motor by a predetermined second reference value in a P stage-engaging direction from the reference position;
measuring a rotation amount of the motor with respect to the reference position; and
determining the gear shift position by determining that the reference position is a P stage when the measured rotation amount of the motor is smaller than a predetermined second reference value, and the reference position is not the P stage when the rotation amount of the motor is equal to or greater than the second reference value.

10. The method of claim 9, wherein the second reference value is greater than a maximum rotation amount by which the motor is capable of rotating in the P stage-engaging direction from the P stage.

11. The method of claim 9, further comprising:
restoring the motor to the reference position after the determining of the gear shift position;
receiving information on the shift stage lever operation of a driver; and
outputting a warning signal when the received shift stage lever operation information and the gear shift position determined in the determining of the gear shift position are different from each other.

* * * * *